(12) United States Patent
Agemura et al.

(10) Patent No.: US 9,536,703 B2
(45) Date of Patent: Jan. 3, 2017

(54) SCANNING ELECTRON MICROSCOPE

(71) Applicant: Hitachi High-Technologies Corporation, Minato-ku, Tokyo (JP)

(72) Inventors: Toshihide Agemura, Tokyo (JP); Hideo Morishita, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/899,795

(22) PCT Filed: Jul. 11, 2014

(86) PCT No.: PCT/JP2014/068529
§ 371 (c)(1),
(2) Date: Dec. 18, 2015

(87) PCT Pub. No.: WO2015/016040
PCT Pub. Date: Feb. 5, 2015

(65) Prior Publication Data
US 2016/0148782 A1  May 26, 2016

(30) Foreign Application Priority Data

Aug. 2, 2013  (JP) .................... 2013-160930

(51) Int. Cl.
*H01J 37/26* (2006.01)
*H01J 37/244* (2006.01)
*H01J 37/28* (2006.01)

(52) U.S. Cl.
CPC ............ *H01J 37/265* (2013.01); *H01J 37/244* (2013.01); *H01J 37/28* (2013.01);
(Continued)

(58) Field of Classification Search
USPC ............................................. 250/310, 396 R
See application file for complete search history.

(56) References Cited

U.S. PATENT DOCUMENTS 6,043,491 A * 3/2000 Ose .................. H01J 37/244
  250/310
6,476,390 B1 * 11/2002 Murakoshi ........... G01N 23/225
  250/306

(Continued)

FOREIGN PATENT DOCUMENTS

JP   11-242941 A   9/1999
JP   2000-299078 A   10/2000

(Continued)

OTHER PUBLICATIONS

International Search Report (PCT/ISA/210) issued in PCT Aplication No. PCT/JP2014/068529 dated Nov. 4, 2014, with English translation (four (4) pages).
Japanese-language Written Opinion (PCT/ISA/237) issued in PCT Aplication No. PCT/JP2014/068529 dated Nov. 4, 2014 (three (3) pages).

*Primary Examiner* — Kiet T Nguyen
(74) *Attorney, Agent, or Firm* — Crowell & Moring LLP

(57) ABSTRACT

This scanning electron microscope is provided with: a deceleration means that decelerates an electron beam (5) when the electron beam is passing through an objective lens; and a first detector (8) and a second detector (7) that are disposed between the electron beam and the objective lens and have a sensitive surface having an axially symmetric shape with respect to the optical axis of the electron beam. The first detector is provided at the sample side with respect to the second detector, and exclusively detects the signal electrons having a high energy that have passed through a retarding field energy filter (9A). When the distance between the tip (13) at the sample side of the objective lens and the sensitive surface of the first detector is L1 and the distance between the tip at the sample side of the objective lens and the sensitive surface of the second detector is L2, then L1/L2≤5/9. As a result, when performing low-acceleration observation using a deceleration method by means of a scanning electron microscope, it is possible to detect signal (Continued)

electrons without the effect of shading in a magnification range of a low magnification on the order of hundreds of times to a high magnification of at least 100,000×. Also, it is possible to highly efficiently detect backscattered electrons, of which the amount generated is less than that of secondary electrons.

19 Claims, 11 Drawing Sheets

(52) U.S. Cl.
CPC . *H01J 2237/0475* (2013.01); *H01J 2237/103* (2013.01); *H01J 2237/1534* (2013.01); *H01J 2237/2448* (2013.01); *H01J 2237/24475* (2013.01)

(56) References Cited

U.S. PATENT DOCUMENTS

| | | |
|---|---|---|
| 6,646,262 B1 | 11/2003 | Todokoro et al. |
| 2002/0185599 A1 | 12/2002 | Kimura et al. |
| 2008/0017797 A1 | 1/2008 | Cheng et al. |
| 2009/0200463 A1* | 8/2009 | Degenhardt .......... H01J 37/244 250/307 |
| 2009/0309024 A1 | 12/2009 | Steigerwald et al. |
| 2014/0299769 A1 | 10/2014 | Okai et al. |

FOREIGN PATENT DOCUMENTS

| | | |
|---|---|---|
| JP | 2008-27737 A | 2/2008 |
| JP | 2012-15130 A | 1/2012 |
| JP | 2013-89514 A | 5/2013 |
| WO | WO 01/75929 A1 | 10/2001 |

* cited by examiner

SCANNING ELECTRON MICROSCOPE

TECHNICAL FIELD

The present invention relates to a scanning electron microscope that detects a signal electron having passed through an objective lens.

BACKGROUND ART

There is a widely known Scanning Electron Microscope (SEM). To acquire a two-dimensional image of a scanning region on the surface of a sample, this SEM detects a signal electron generated when the sample is scanned by an irradiation electron beam converged on the sample and displays the signal strength at each irradiation position in synchronization with a scanning signal of the irradiation electron beam.

In an ordinary SEM, the chromatic aberration increases in a low-acceleration region, and a high resolution cannot be achieved. To reduce the chromatic aberration, the deceleration method is effective. By the deceleration method, high-speed passage is made through an objective lens, and irradiation is performed by decelerating the irradiation electron beam directly in front of the sample. Application of the deceleration method decreases the effects of electrical charging and damage caused by electronic irradiation and enables acquisition of information on the sample top surface at a high resolution. Accordingly, a low-deceleration SEM is used for sample surface observation in a variety of fields.

SEM-detected signal electrons are largely divided into backscattered electrons and secondary electrons in terms of the energy released from a sample surface. An electron released to the outside of the sample due to elastic or inelastic scattering of an irradiated irradiation electron beam within the sample is referred to as a Backscattered Electron (BSE). A low-energy signal electron generated in the inelastic scattering process of a backscattered electron and released from the sample surface to the outside of the sample is referred to as a Secondary Electron (SE). FIG. 1 illustrates example energy distribution of secondary electrons (SE) and backscattered electrons (BSE) generated when the energy of an irradiation electron beam is E0. A signal electron with an energy of below 50 eV is commonly referred to as a SE whose generation amount peaks at an energy of several eV. A BSE has a peak at an energy approximately equal to the energy of an irradiation electron. The generation amounts of secondary and backscattered electrons depend on, inter alia, the elements constituting the sample and the energy of an irradiation electron beam. In general, the generation amount of secondary electron is greater than that of backscattered electron.

The generation amount of backscattered electron depends on the average atomic number, density, and crystallinity of a sample at the irradiating position of an irradiation electron beam. When a secondary electron is not detected and only a backscattered electron is detected in an SEM image, a contrast that reflects sample composition and crystal orientation differences can be obtained. To the contrary, as a secondary electron is generated on the sample surface, a contrast reflecting sample unevenness and electric potential differences can be acquired. By separately detecting a secondary electron and a backscattered, electron, different types of sample information can be acquired. There exist many types of SEMs installed with a plurality of detectors that are directed to separately acquiring various types of sample information acquired from SEM observation.

In particular, during SEM observation in a low-acceleration region, it is necessary to reduce the aberration generated when an irradiation electron beam passes through an objective lens so as to achieve a high resolution. The distance between the sample and the top end portion of an objective lens (Working Distance: WD) needs to be set to a small value, i.e., below several mm. When the deceleration method is employed under these observation conditions, many signal electrons pass through the objective lens while being accelerated. A detector directed to detecting a signal electron should be installed closer to the electron source side than to the objective lens. In an SEM provided with the above type of detection system, separately obtaining different types of sample information using different detectors tends to be considered important.

CITATION LIST

Patent Literatures

PTL 1: JP Patent Publication (Kokai) 2012-15130 A
PTL 2: JP Patent Publication (Kokai) 2000-299078 A
PTL 3: WO 01/075929 A

SUMMARY OF INVENTION

Technical Problem

The present inventors conducted low-acceleration SEM observation using the deceleration method and assiduously examined the observation results. As a result, the following knowledge was obtained:

Contrary to transmission electron microscopes and scanning transmission electron microscopes, an SEM has the advantage of changing the scanning range of an irradiation electron beam to enable observation at constantly changing magnification factors in the range from several hundred times to several hundred thousand times even when the sample size is greater than several $mm^3$. However, in the method of using a detector arranged between an electron source and an objective lens to detect a signal electron having passed through the objective lens, the signal electron travels via the lens field and the deflection field along the path to reach the detector. The position where the signal electron reaches depends eventually on the generation position on the sample. In particular, when a signal electron that is significantly deflected off from the axis is observed at a low magnification factor, a shade-like contrast that does not resemble the sample shape eventually appears on a part of an SEM image, the cause of which is the signal electron not reaching a sensitive surface of the detector. This phenomenon is called shading. When observing an SEM image, it is desirable to avoid occurrence of shading as much as possible.

In an SEM, different types of information are contained in a secondary electron and a backscattered electron that are detected as signal electrons. It is known that unevenness and electric potential information can be obtained when a secondary electron generated on a sample surface is detected. Also, it is known that an image where composition and crystal orientation information is emphasized is acquired when a backscattered electron is detected. Therefore, if there is a mechanism to separately detect secondary and backscattered electrons generated at the same position to which an irradiation electron beam is irradiated, different types information can be simultaneously acquired from the same observation field.

In particular, when element or crystal orientation analysis, such as Energy Dispersive X-ray Spectroscopy (EDX) or Electron Backscatter Diffraction (EBSD), is performed, field of vision search is often conducted using a backscattered electron image, and an SEM from which a contrast derived from the backscattered electron can be obtained regardless of the magnification factor is necessary. However, the generation amount of backscattered electron is smaller than the generation amount of secondary electron. Depending on the detection ratio, it is eventually difficult to conduct focus adjustment while observing an SEM image in which only a backscattered electron is detected. It is convenient to have a focus adjustment feature using an SEM image of secondary electrons, whose generation amount is large, for one observation field so as to acquire an SEM image of backscattered electrons for the same observation field. If it is possible to perform observation without shading in the range between high and low magnification factors to acquire different types of sample information from one field, such a feature enables easy acquisition of desired sample information and is user-friendly.

PTL 1 discloses a detection means using two detectors disposed in a cylindrical electrode whose electric potential is higher than the electric potential of a sample. Specifically, one detector on the electron source side and mounted with an energy filter shields a secondary electron and detects a backscattered electron, and the other detector installed on the sample side detects a secondary electron. In the detection system thus configured, to detect a backscattered electron by the detector on the electron source side, and a passing hole needs to be provided in the central portion of the sample-side detector. Use of the sample-side detector alone to acquire an SEM image at a low magnification factor causes shading due to this passing hole. When an irradiation electron beam is deflected, a signal electron generated outside of the axis passes through the objective lens and in turn travels to the outside of the axis due to the effect of the lens field and the deflection field. A signal electron generated along the optical axis is not detected because a signal electron travelling near the axis passes through the passing hole on the sample-side detector. On the other hand, a signal electron generated at off-axis position can be detected by the sample-side detector. However, the sample-side detector also detects signal electrons generated outside of the axis, which are intended to be detected by the electron-source-side detector. Accordingly, when an SEM image is acquired by only the detector that is installed on the sample side to detect a secondary electron, the central portion of the SEM image is dark without regard to the sample information, and a contrast in which the brightness is greater as the distance to the periphery of the image is shorter, i.e., shading is observed. However, in the arrangement of the detectors of PLT 1, images of secondary and backscattered electrons can be separately acquired. In an SEM image acquired by the sample-side detector or the detector on the electron source side, it is in principle not possible to avoid shading generated during observation at a low magnification factor.

Only backscattered electrons that are emitted approximately toward the optical axis direction are detected by the electron-source-side detector. In the case of a flat sample, the angular distribution of a generated signal electron is known to be in accordance with the cosine law, and a small number of backscattered electrons are generated in the optical axis direction. When this method is employed to detect backscattered electrons, the detected electrons account for only a low percent of all the generated backscattered electrons. When observing a sample, such as a biological sample, that tends to be readily damaged by irradiation of an irradiation electron beam and for which a probe current cannot be set to a sufficiently large value, an SEM image with a sufficient contrast cannot be obtained.

PLT 2 discloses a method of separately detecting, based on the path difference, a backscattered electron and a secondary electron having passed through an objective lens field in an SEM mounted with an objective lens in which the deceleration method is applied and an electromagnetic field is superimposed. Here, a secondary electron detector is installed on the electron source side, and a backscattered electron detector is disposed on the sample side. In this configuration, the backscattered electron detector is not provided with a secondary electron shielding means, such as an energy filter. By controlling the electromagnetic field formed on the signal electron path, the type of signal electron energy detected by each detector is filtered. When the backscattered electron and secondary electron paths are changed by changing the acceleration voltage or WD, desired sample information separation and detection cannot be readily conducted. Also, the disclosure of PUT 2 does not refer to shading. However, when a deflector is disposed at the position illustrated in the drawing and a probe electron is significantly deflected, a secondary electron generated outside of the axis is likely to be shielded by the sample-side detector. During observation of an SEM image by this detector at a low magnification factor, darkening of the periphery of the field of vision without regard to the sample information, i.e., shading occurs.

PLT 3 discloses a means of separating and detecting a backscattered electron and a secondary electron having passed through an objective lens field in an SEM mounted with an objective lens in which the deceleration method is applied and an electromagnetic field is superimposed. As in the case of PLT 1, a backscattered electron detector is installed on the electron source side, and a secondary electron detector is installed on the sample side. An energy filter is installed in front of the backscattered electron detector. The irradiated electron beam is not deflected toward off-axis position. The back-scattered electrons that passed through the energy filter collide with a conversion electrode, generating signal electrons with low energy. The signal electrons are guided to a sensitive surface of a detector installed at off-axis position. The conversion electrons with low energy which are generated due to collision with the energy filter are detected as the secondary electrons. This method uses two identical Wien filters applying electric and magnetic fields that are perpendicular to the optical axis and orthogonal to each other. In this configuration, the electric and magnetic fields of the two Wien filter are applied opposite to each other. When a crossover of an irradiation electron beam is set to occur at the midpoint between the two Wien filters, the chromatic dispersions generated by the Wien filters can be offset. General-purpose equipment needs be configured so that observation can always be made under the optimal conditions where the acceleration voltage or WD is changed. For this reason, a configuration where two condenser lenses are mounted is common for using a general-purpose SEM to separately control the probe current and the aperture angle on the sample. To embody the method of PLT 3 in general-purpose equipment, another condenser lens needs to be mounted so that the crossover position is controlled to always be at the midpoint of the Wien filters. Such a configuration of general-purpose equipment is not preferable as optical axis adjustment and optical system control are complicated.

Moreover, this method uses an energy filter to shield a secondary electron and detect a passed backscattered electron. A low-energy conversion electron generated by backscattered electron collision is detected by a detector installed outside of the axis. Accordingly, there is a type of shading caused by the situation where a conversion electron generated on the detector side with respect to the optical axis is likely to be detected and a conversion electron generated on the other side with respect to the optical axis is not likely to be detected. It is possible that this type of shading is observed in an SEM image at a low magnification factor The conversion electron generation efficiency is known to be maximized when an electron with an energy of approximately 1 keV collides with, e.g., a metal conversion electrode. Collision of an electron with a higher energy reduces the conversion efficiency. When the irradiation energy of an irradiation electron beam to the sample is set to E0, the energy range of a generated backscattered electron is E0 or below. The detection efficiency of a signal electron with an energy in the neighborhood of 1 keV is high in the case of E0≥1 keV. However, in the case of E0>>1 keV, the conversion efficiently is reduced, and the detection efficiency is reduced as well.

The present invention is directed to providing an SEM that can acquire a shading-free image at a magnification factor ranging from a small magnification factor to a large magnification factor, i.e., ranging from several hundred to over one hundred thousand when detecting a signal electron having passed through an objective lens during low acceleration SEM observation to which the deceleration method is applied. Also, the present invention is directed to providing an SEM that can highly efficiently detect a backscattered electron which is smaller than a secondary electron in terms of generation amount.

Solution to Problem

The present invention, for example, provides an SEM adopting a deceleration optical system. The SEM includes: two detection means that detect an accelerated signal electron having passed through an objective lens and have sensitive surfaces arranged axisymmetrically with reference to the optical axis, wherein the two detection means are between an electron gun and the objective lens of the SEM; a first detector that detects a backscattered electron that is not shielded by and has passed through an energy filter installed in front of the sensitive surface to shield a secondary electron; a second detector that detects a secondary or backscattered electron, wherein the first detector is closer to the sample side than the second detector is; and a signal processing circuit directed to performing linear addition of output signals from the first detector and the second detector. The arrangement of the SEM satisfies $L1/L2 \leq 5/9$, where L1 denotes the distance between the sensitive surface of the first detector and the top end portion of the objective lens and L2 denotes the distance between the sensitive surface of the second detector and the top end portion of the objective lens.

Advantageous Effects of Invention

According to the present invention, secondary electron and backscattered electron images can be separately and simultaneously acquired, for example, while observing a sample top surface at a high resolution in a low acceleration region of 5 kV or below. By arranging detectors as described above, the solid angle of a passing hole provided at the center of the second detector facing the top end portion of the objective lens becomes smaller. During observation at a high magnification factor, shading caused by passing through the center of the second detector can be reduced. During observation at a low magnification factor, a signal electron that travels in the off-axis direction and is not detected by the second detector can be detected by the first detector. By outputting linear addition signals of the first detector and the second detector, shading during observation at a low magnification factor can be reduced. In view of the above, an SEM that decreases the effect of shading in a broad magnification factor range can be provided.

Also, according to the present invention, for example, the first detector that has sensitive surfaces shaped to be axisymmaetrical with reference to the optical axis and is directed to detecting a backscattered electron is installed closer to the sample side than is the second detector for detecting a secondary electron. Considering the angle distribution of signal electrons assumedly generated from a flat sample, the first detector can perform detection in an angle range in which the generation amount is greater than the generation amount in the angle range of the second detector. An SEM capable of detecting a backscattered electron more effectively than the conventional SEM can be provided.

DESCRIPTION OF EMBODIMENTS

Figure 1:
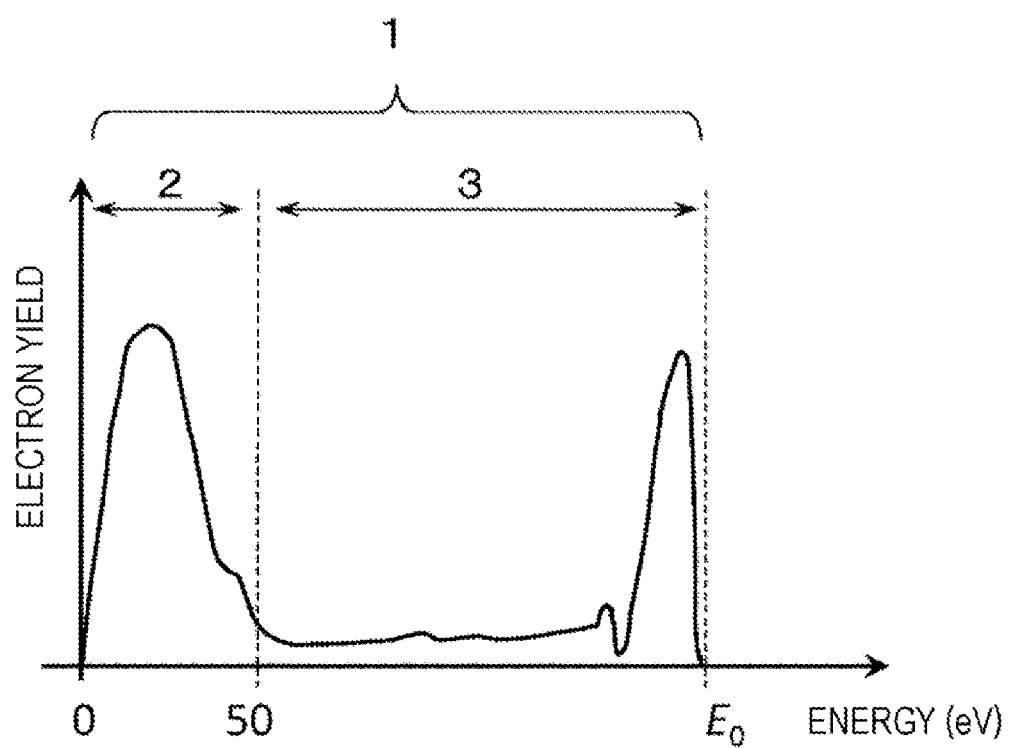
FIG. 1 is a diagram illustrating a general energy distribution of a released electron.

Embodiments disclose a scanning electron microscope including: an electron source that generates an electronic beam acting as a probe; an aperture that limits the diameter of the electronic beam; a sample stand mounted with a sample to which the electronic beam is irradiated; an electron lens including an objective lens that converges the electronic beam to the surface of the sample; a deceleration means that decelerates the electronic beam having passed the objection lens as the electronic beam nears the sample; a deflector that scans the electronic beam on the sample; and at least two detectors that detect only a signal electron, the signal electron having passed through the objective lens, of all the signal electrons released from the sample. The two detectors are arranged between the electron source and the objective lens. The two sensitive surfaces are shaped to be axisymmetrical with reference to the optical axis. When one of the detectors is a first detector disposed to constantly detect a high-energy signal electron having passed through a retarding field energy filter and the other of the detectors, which is different from the first detector, is a second detector, the first detector is installed closer to the sample side than the second detector is. L1/L2≤5/9 holds true where L1 denotes the distance between the top end portion on the sample side of the objective lens and a sensitive surface of the first detector and L2 denotes the distance between the top end portion on the sample side of the objective lens and a sensitive surface of the second detector.

The embodiments also disclose further inclusion of a signal processing circuit directed to performing linear addition of output signals from the first detector and the second detector.

The embodiments also disclose that the first detector detects a backscattered electron, and the second detector detects a secondary electron.

The embodiments also disclose that the retarding field energy filter is provided as a unit separate from the first detector.

The embodiments also disclose that the retarding field energy filter is provided as a unit integrated with the first detector.

The embodiments also disclose that the retarding field energy filter is installed on the sample side with respect to the sensitive surface of the second detector, and a high-energy electron having passed through the deceleration electric field energy filter is detected by each of the first detector and the second detector.

The embodiments also disclose that the detection solid angle of the first detector facing the top end portion of the objective lens is greater than the detection solid angle of the second detector.

The embodiments also disclose that a detector used as the first detector or the second detector is: a semiconductor detector; a detector that employs an avalanche diode, a micro channel plate, or a scintillator material as a constituent element; or a combination of the aforementioned types of detectors.

The embodiments also disclose a scanning electron microscope including: an electron source that generates an electronic beam acting as a probe; an aperture that limits the diameter of the electronic beam; a sample stand mounted with a sample to which the electronic beam is irradiated; an electron lens including an objective lens that converges the electronic beam to the surface of the sample; a deceleration means that decelerates the electronic beam having passed through the objective lens as the electronic beam nears the sample; a deflector that scans the electronic beam on the sample; and at least two conversion plates that are collided with only a signal electron, the signal electron having passed through the objective lens, of all the signal electrons released from the sample. The two conversion plates are arranged between the electron source and the objective lens. Collision surfaces of the two conversion plates are shaped to be axisymmetrical with reference to the optical axis. When one of the conversion plates is a first conversion plate disposed to be constantly collided with a high-energy signal electron having passed through a retarding field energy filter and the other of the conversion plates, which is different from the first conversion plate, is a second conversion plate, the first conversion plate is installed closer to the sample side than the second conversion plate is. L1/L2≤5/9 holds true where L1 denotes the distance between the top end portion on the sample side of the objective lens and a collision surface of the first conversion plate and L2 denotes the distance between the top end portion on the sample side of the objective lens and a collision surface of the second conversion plate.

The embodiments also disclose further inclusion of: first and second detectors including sensitive surfaces that detect a conversion electron released from the collision surface to the sample side by a signal electron having collided with the first conversion plate, wherein the first and second detectors are arranged outside of the optical axis and axisymmetrical with reference to the optical axis; and third and fourth detectors including sensitive surfaces that detect a conversion electron released from the collision surface to the sample side by a signal electron having collided with the second conversion plate, wherein the third and fourth detectors are arranged outside of the optical axis and axisymmetrical with reference to the optical axis. The embodiments also disclose further inclusion of a signal processing circuit directed to performing linear addition of output signals from the first, second, third, and fourth detectors.

The embodiments also disclose that a conversion electron generated by collision of a backscattered electron with the first conversion plate is detected, and a conversion electron generated by collision of a secondary electron with the second conversion plate is detected.

The embodiments also disclose that the retarding field energy filter is provided as a unit separate from the first conversion plate.

The embodiments also disclose that the retarding field energy filter is provided as a unit integrated with the first conversion plate.

The embodiments also disclose that the retarding field energy filter is installed on the sample side with respect to the sensitive surface of the second conversion plate and that a high-energy electron having passed through the deceleration electric field energy filter collides with each of the first conversion plate and the second conversion plate.

The embodiments also disclose that the collision solid angle of the first conversion plate facing the top end portion of the objective lens is greater than the collision solid angle of the second conversion plate.

The embodiments also disclose that a detector used in the first, second, third, or fourth detector is a detector that employs a scintillator material as a constituent element or a combination of the aforementioned detectors.

The embodiments also disclose that the collision surfaces of the first and second conversion plates contain a material whose atomic number is 50 or higher.

The embodiments also disclose that the collision surfaces of the first and second conversion plates contain a material having a negative electron affinity.

The aforementioned novel features and effects of the present invention as well as other novel features and effects of the present invention are hereinafter illustrated in reference to the drawings. The drawings are intended to be solely used for understanding of the invention and are not to restrict the scope of protection.

First Embodiment

Figure 2:
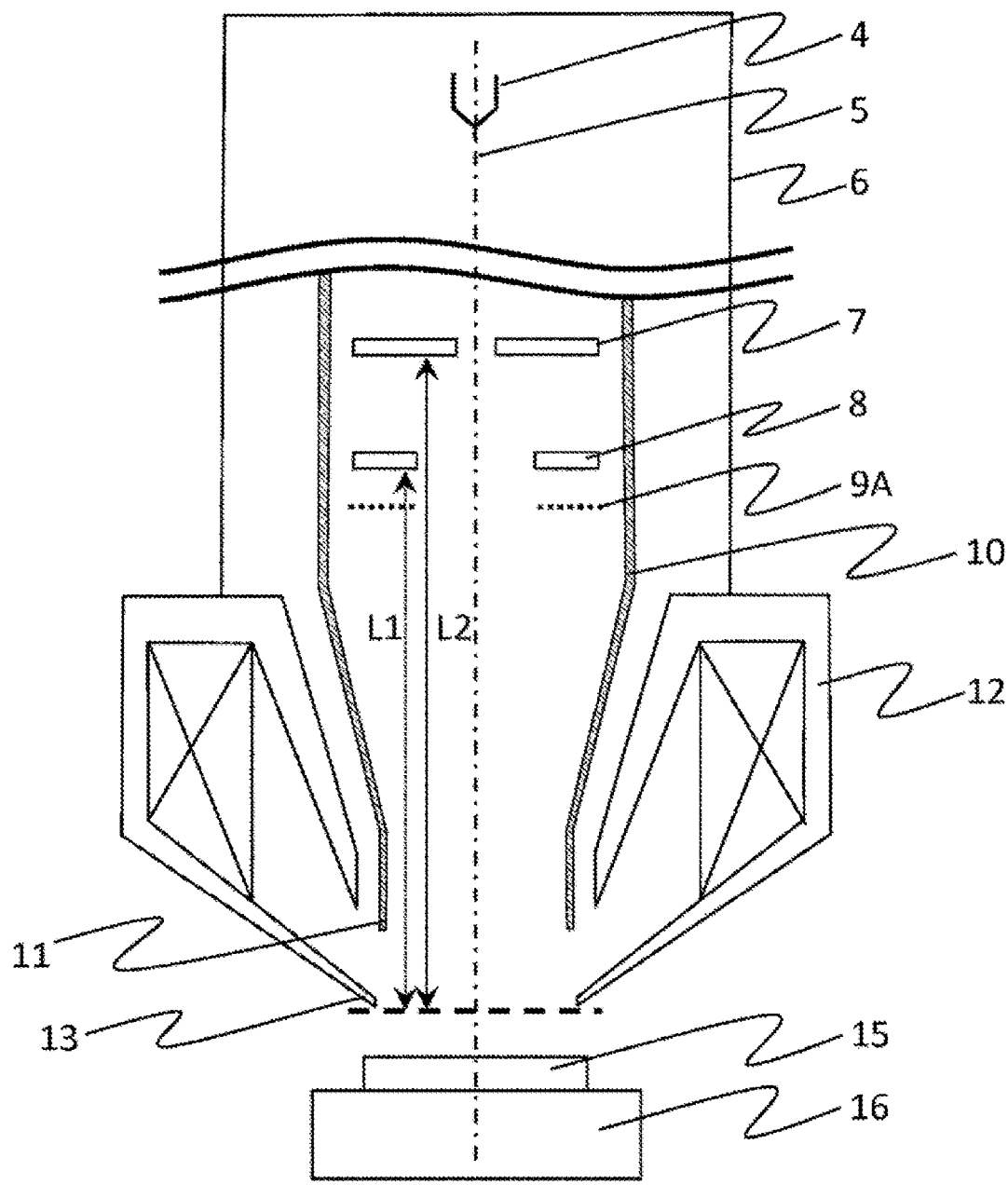
FIG. 2 is a schematic cross-sectional diagram illustrating a scanning electron microscope according to a first embodiment.

FIG. 2 illustrates a conceptual diagram of the overall configuration of a scanning electron microscope according to this embodiment. The scanning electron microscope illustrated in FIG. 2 largely includes: an electron gun 4 with a mechanism to irradiate an irradiation electron beam to a sample 15; an aperture directed to limiting the diameter of the irradiation electron beam; an electron lens, such as a condenser lens or objective lens; a detector directed to mainly detecting a secondary electron 2; a detector directed to mainly detecting a backscattered electron 3; an energy filter 9A directed to shielding the secondary electron 2; a deflector; a controller that controls a sample stand 16 on which the sample 15 is placed and which moves the sample 15 and determines an observation region, the mechanism of the sample stand 16, SEM image display equipment, and the entire SEM; and a vacuum exhaust facility. The position of the sensitive surface of the detector where each signal electron reaches depends on a deflection field formed on the signal electron path. It is possible to assume that the path of a signal electron accelerated in a deceleration optical system does not essentially depend on the position of the deflection field. According to this embodiment, the deflector installation position is optional.

FIG. 2 illustrates the positions of sensitive surfaces of the detectors directed to detecting secondary and backscattered electrons as sensitive surfaces 7 of a second detector and sensitive surfaces 8 of a first detector, respectively. As illustrated in FIG. 2, the sensitive surfaces 8 of the first detector directed to detecting a backscattered electron are installed closer to the sample 15 side than the sensitive surfaces 7 of the second detector directed to detecting a secondary electron are.

Various types of electron guns, such as the Cold Field Emission (CFE), Schottky Emission (SE), and Thermionic Emission (TE) types, fall into the category of the electron gun 4. An electron gun to be mounted on a scanning electron microscope is selected from among the above types according to the desired equipment performance.

The objective lens of the scanning electron microscope according to this embodiment is of an out-lens type whose leakage magnetic field toward the sample 15 is small. A cylindrical electrode 10 is installed along the inner wall of the objective lens magnetic path of the scanning electron microscope. The electric potential of the cylindrical electrode 10 is set to be higher than the electric potential of the objective lens magnetic path 12. Thereby, a deceleration electric field against an irradiation electron beam is formed between a sample side tip 12 of the cylindrical electrode and a sample side tip 13 of an objective lens magnetic path. In this configuration, as the irradiation electron beam passes therethrough, deceleration gradually increases. The electric potential difference between the objective lens magnetic path 12 and the sample 15 is set to be 1 kV or below. Gap portions between the cylindrical electrode 10 and the objective lens magnetic path 12 as well as between the cylindrical electrode 10 and an SEM barrel 6 are configured to be electrically insulated by an unillustrated insulator.

Figure 3:
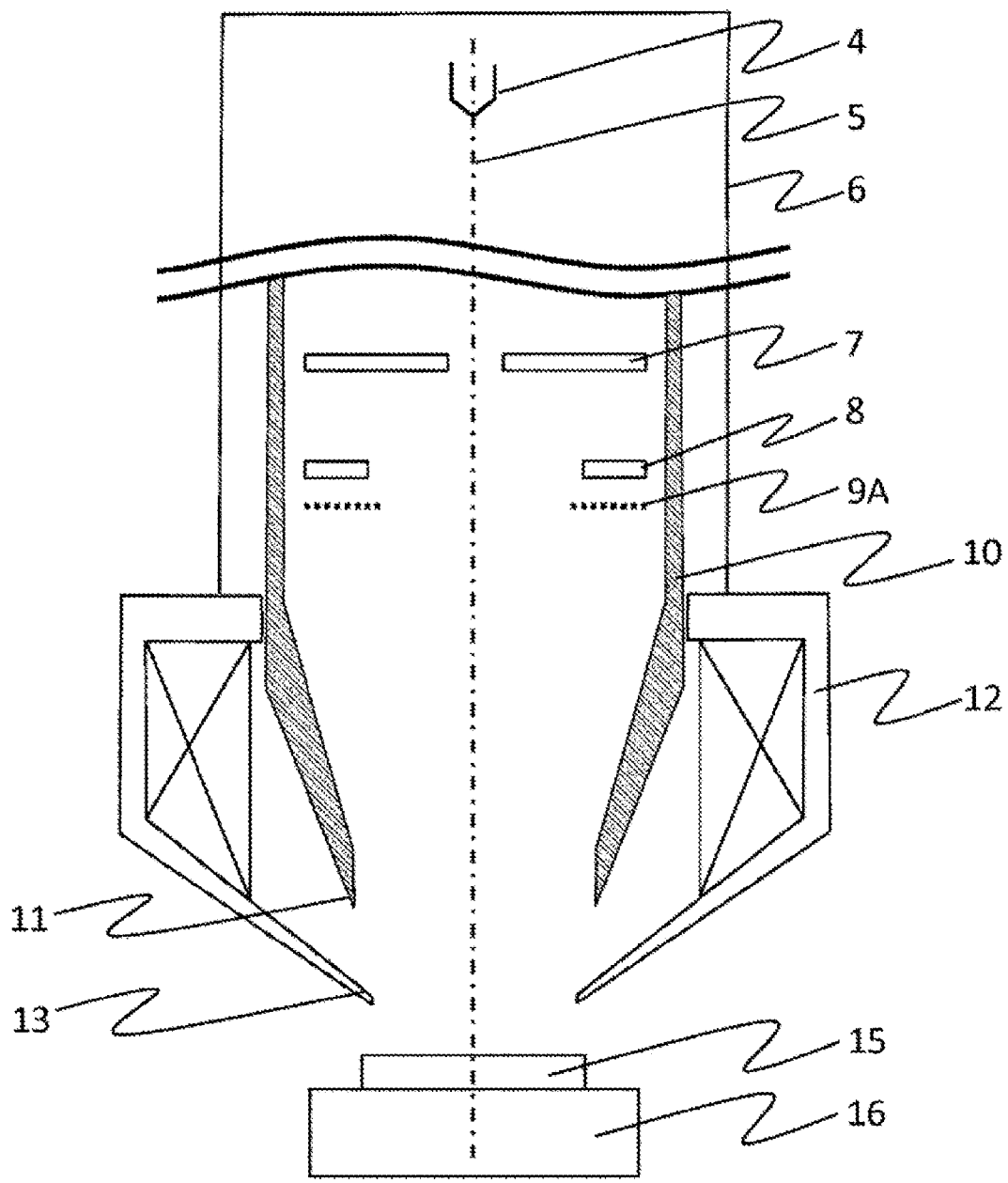
FIG. 3 is a schematic cross-sectional diagram illustrating a scanning electron microscope according to the first embodiment.

To produce the same effect, as illustrated in FIG. 3, the cylindrical electrode 10, which is made of a magnetic body, can be used as a part of the objective lens magnetic path 12. In this case, in the region where the cylindrical electrode 10 and the objective lens 12 are magnetically coupled, the cylindrical electrode 10 and the objective lens 12 are configured to be electrically insulated by an unillustrated insulator.

In particular, to achieve a high resolution under the observation condition where the irradiation voltage of an irradiation electron beam is 5 kV or below, the electrical potential of the cylindrical electrode 10 needs to be higher than the electrical potential of the sample 15 so as to form a deceleration electric field. This electrical potential difference is denoted by Vd. In the configuration according to the present invention, the value of Vd is set to approximately 10 kV. To reduce the chromatic aberration caused by passing through the objective lens, it is desirable to set the distance (WD) between the sample 15 and the sample side tip 13 (top end portion) of the objective lens magnetic path to 10 mm or below.

When configuring the deceleration electric field in the above manner, the electrostatic lens action stays the same as long as the electric potential difference Vd is constant. In the method called acceleration-deceleration method, the electrical potential of the sample is set as the ground potential, and the electrical potential of the position closer to the light source side is set to a higher electrical potential. In the method called deceleration method, the electrical potential of the objective lens is set as the ground potential, and the electrical potential of the sample is set to a negative value. In these methods, the same electrostatic lens action can be acquired from identically formed electrical potential distributions. Hereinafter, the acceleration-deceleration method and the deceleration method are not distinguished and unified as a deceleration method.

Under the above observation conditions, a part of the signal electron 1 generated from the sample 15 is converged by an electric field formed between the sample side tip 11 of the cylindrical electrode 10 and the tip 13 of the objective lens magnetic path and a magnetic field formed by the objective lens 12. In turn, the aforementioned part of the signal electron 1 is accelerated by the electric field and travels in the direction opposite of the travel direction of the irradiation electron beam.

The sensitive surfaces 8 of the first detector and the sensitive surfaces 7 of the second detector are both arranged axisymmetrical with reference to the optical axis, and the electric potentials of the sensitive surfaces 8 and the sensitive surfaces 7 are equal to the electric potential of the cylindrical electrode 10. Thereby, there is an electric potential difference Vd between the sample 15 and the sensitive surface 8 of the first detector as well as between the sample 15 and the sensitive surface 7 of the second detector. A part of a signal electron generated from the sample 15 is accelerated with an energy of approximately 10 keV and reaches the sensitive surface 8 of the first detector or the sensitive surface 7 of the second detector. This amount of energy is sufficient for detection by the existing electron detector.

Detection units in which the arrangement of the illustrated sensitive surfaces can be achieved and a signal electron accelerated with an electric potential difference Vd can be detected are adopted as the first detector and the second detector. A semiconductor detector; a detector using an avalanche diode, a micro channel plate, or a scintillator material as a constituent element; or the like is conceivable. Any of these types of detectors may be used. Also, different types of detectors may be adopted as the first detector and the second detector as long as the difference does not cause a problem in the below-mentioned linear addition of signals.

In many cases, to detect a signal electron, a detector in which a scintillator material is used on a sensitive surface is typically installed for an increased magnification factor and responsiveness. When such a detector is used as the first detector and the second detector according to this embodiment, the detector can detect a signal electron in the same principle as the principle of a Everhart & Thornley type-detector (hereinafter referred to as "ET type"), which is in general used as a detector of a scanning electron microscope. This detector includes: a scintillator that converts an accelerated signal electron into light; and a photomultiplier tube that coverts the light into a photoelectron and amplifies the photoelectron, wherein the scintillator and the photomultiplier tube are connected by a light guide therebetween. The scintillator emits sufficient light when the energy of an incident signal electron is 5 keV or higher. By guiding this light to a sensitive surface of the photomultiplier tube via the light guide, the signal electron 1 can be detected as an electric signal. As a scintillator is an insulator, collision of a signal electron causes electrification. Deceleration eventually occurs immediately before reaching the sensitive surface. To avoid this, it is desirable that the scintillator surface is deposited and covered with a conductor, such as Al. This metal covering produces an effect of reflecting light emitted by the scintillator to the photomultiplier tube side without leaking the light to the outside. The sensitive surfaces 8 of the first detector and the sensitive surfaces 7 of the second detector, which are illustrated in FIG. 2, are defined to be the same as a conductor surface covering the aforementioned scintillator surface. In this case, the conductor of the scintillator surface and the cylindrical electrode 10 are equal in terms of electric potential.

Figure 4:
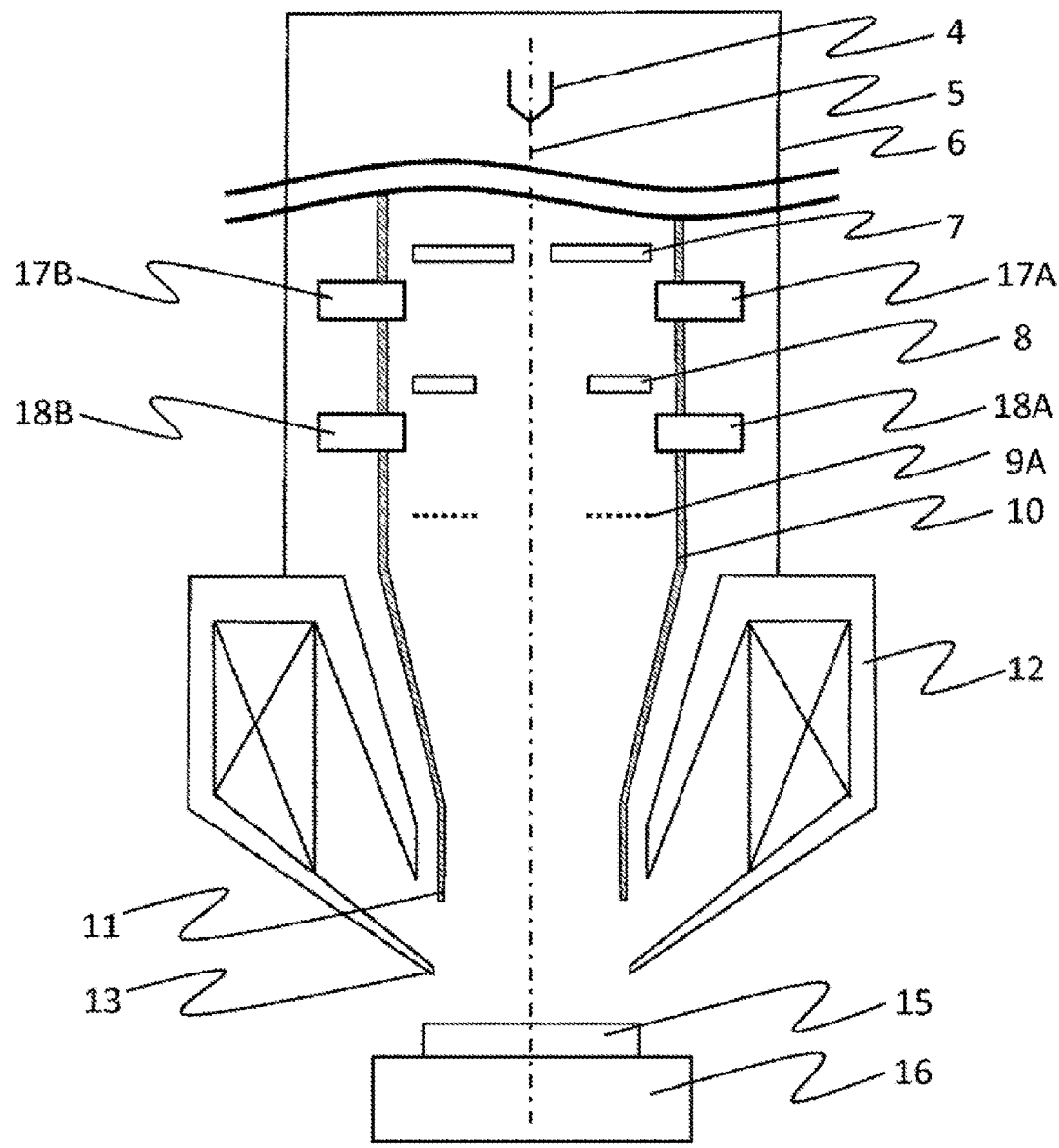
FIG. 4 is a schematic cross-sectional diagram illustrating a scanning electron microscope according to the first embodiment.

Using an ET-type detector installed outside of the optical axis to detect a low-energy conversion electron generated by collision of an accelerated high-energy electron with a conversion electron is an acceptable method. In this case, the conversion electrode is deemed as a sensitive surface of the first detector or the first second detector, and the electric potential of the conversion electrode is set equal to the electrical potential of the cylindrical electrode 10. The sensitive surface of the detector installed outside of the axis is set to an electric potential equal to or greater than the electric potential of the cylindrical electrode 10. Thereby, a low-energy conversion electron generated at the conversion electrode is collected by the sensitive surface of the detector outside of the axis. In the method of using a detector outside of the axis to detect a conversion electrode, the number of conversion electrons reaching the sensitive surface of the detector changes depending on the distance between the location where a conversion electron is generated and the detector outside of the axis, and there is a possibility that the aforesaid change causes shading. Shading during observation at a low magnification factor can be avoided by the arrangement illustrated in FIG. 4 where first detectors 18A, 18B directed to detecting a conversion electron outside of the axis and second detectors 17A, 17B directed to detecting a conversion electron are axisymmetrical with reference to the optical axis. In this case, by performing linear addition of output signals of the two detectors arranged axisymmetrical with reference to the optical axis, acquisition of an SEM image with reduced shading is expected.

It is desirable that the surface portion of a conversion electrode is made of a material with a large secondary electron release amount. Typically, a film of a metal, such as gold (Au, atomic number 79), is used. To produce the same effect, it is possible to use a film of a material, the secondary electron release amount of which is larger than that of an ordinary metal, such as magnesium oxide or diamond whose electron affinity is high.

When the first detector and the second detector are of the same type, the backscattered electron 3 and the secondary electron 2 having traveled to the sensitive surfaces of the detectors are detected. When not the secondary electron 2, but the backscattered electron 3 is detected by the first detector, an energy filter 9A needs to be installed in front of the sensitive surface 8 of the first detector.

This energy filter 9A may be installed as an element integrated with the first detector or separate from the first detector. In the case of installing as a separate element, the energy filter 9A needs to be arranged so that all the signal electrons 1 heading to the sensitive surface 8 of the first detector must pass through the energy filter 9A prior to reaching the sensitive surface 8 of the first detector. A desirable configuration is where a change to an electric field extending to outside of the energy filter caused by turning on and off the filter does not affect the irradiation electron beam path.

The path of the signal electron 1 depends on an electric filed formed between the sample side tip 11 of a cylindrical electrode and the sample side tip 13 of the objective lens magnetic path as well as on a magnetic field formed by the objective lens 12. By changing the position of the sample 15 and the irradiation voltage of an irradiation electron beam, the excitation required for focusing the irradiation electron beam on the surface of the sample 15 changes, and the path of the signal electron 1 changes accordingly. Since the electric field and magnetic field of the objective lens are controlled to focus an irradiation electron beam, the electric field and magnetic field cannot be controlled to control the path of the signal electron 1.

An ordinary SEM is used by changing the observation conditions, such as the acceleration voltage and WD, in various manners. Thus, it is assumed that the secondary electron 2 and the backscattered electron 3 are mixed depending on the observation conditions and detected by the first detector and the second detector. However, when acquiring an SEM image of the secondary electron 2, the release amount of the secondary electron 2 generated according to the energy distribution of FIG. 1 is sufficiently greater than that of the backscattered electron 3. Even when a backscattered electron is mixed, the acquired image is close to a secondary electron image in terms of image quality. To separately detect the backscattered electron 3, whose generation amount is smaller than that of the secondary electron 2, an energy filter 9A that shields the secondary electron 2 is necessary since mixture of the secondary electron 2 causes inclusion of the information on the secondary electron 2 in an SEM image.

When a signal detected by the second detector is displayed as an SEM image in order to acquire an SEM image of the secondary electron 2, darkening of the periphery of the SEM image at a low magnification factor, i.e., shading is observed, as in the case of the detector on the electron source side of PLT 1. To avoid this, the energy filter 9A is turned off during observation at a low magnification factor, and the signal electron 1 is detected by the first detector and the second detector. By performing linear addition of signals of the two detectors so as to be displayed as an SEM image, the effect of shading can be reduced. Since signals detected by the two detectors are displayed as an SEM image, it is expected that the amount of the signals thus detected increases compared with the amount of signals detected and displayed as an SEM image by the second detector alone and that an SEM image of a secondary electron with a large S/N value can be acquired.

Where L1 denotes the distance between the sensitive surface of the first detector and the sample-side top end portion of the objective lens and L2 denotes the distance between the sensitive surface of the second detector and the sample-side top end portion of the objective lens top end portion, it is desirable to make an arrangement that satisfies $L1/L2 \leq 5/9$. This arrangement is created to reduce shading during observation of a secondary electron image at a low magnification factor using the aforementioned method and to highly efficiently detect a backscattered electron by the first detector. The reason is hereinafter described.

After passing through the objective lens, many signal electrons generated outside of the axis during SEM observation at a low magnification factor move away from the optical axis as the signal electrons separate from the sample. Signal electrons generated at a position whose distance from the optical axis is long are mainly detected by the first detector installed on the sample side first detector. However, the area of the sensitive surface of the detector cannot be set to an infinitely large value. A desirable configuration to efficiently detect a signal electron outside of the axis by the first detector with a finite sensitive surface area is where the sensitive surface is close to the sample—specifically, where L1 is small.

Meanwhile, as a conversion action from the objective lens acts on a signal electron generated near the optical axis, the distance from the axis is relatively short. Many signal electrons generated near the optical axis pass through the center hole of the first detector and detected by the second detector. As illustrated in FIG. 2, an electron passing hole is provided at the central portion of each of the first detector and the second detector. Some signal electrons that are generated near the optical axis and should be detected by the second detector pass through the center hole of the second detector and are not detected. A desirable configuration to effectively reduce the number of signal electrons passing through the center hole is where the sensitive surface of the second detector installed on the electron source side is located at a position far from the sample—specifically, where L2 is large.

In view of the above, the structure where L1/L2 is as small as possible is desirable due to the configuration of the detectors, but the value of L1/L2 is restricted by the arrangement of an objective lens or condenser lens constituting the optical system. The first detector and the second detector are both installed between the objective lens and the electron source. The position of the sensitive surface of the first detector depends on the dimensions and structure of the objective lens and the energy filter, and the sensitive surface cannot be installed near the sample without limitation. Considering the arrangement of constituent elements of the optical system so that the acceleration voltage and WD are changeable for use, the position of the sensitive surface of the second detector cannot be separated from the sample without limitation. In light of the aforementioned restrictions, the ranges of L1 and L2 based on the signal electron path in an assumed configuration of the electronic optical system of the SEM were assessed. The assessment found that the arrangement satisfying $L1/L2 \leq 5/9$ can reduce the effect of shading observed in the aforementioned secondary electron detection method more than the conventional method can.

When detecting a signal electron in the aforementioned method, a backscattered electron with an energy of 5 keV or below is exposed to a convergence action during the process of passing through the objective lens, and the signal electron path is widely spread due to the energy difference and reaches the sensitive surface of the detector. The number of backscattered electrons reaching the sensitive surface of the first detector installed on the sample side is greater than the conventional method. As the size of the center hole of the first detector decreases, the amount of backscattered electron detected by the first detector increases, and the effect of shading observed in an SEM image acquired by the first detector can be reduced. A desirable configuration to mainly detect a backscattered electron is where the solid angle of the sensitive surface 8 of the first detector facing the sample side tip 13 of the objective lens magnetic path is greater than the solid angle of the sensitive surface 7 of the second detector.

Figure 5:
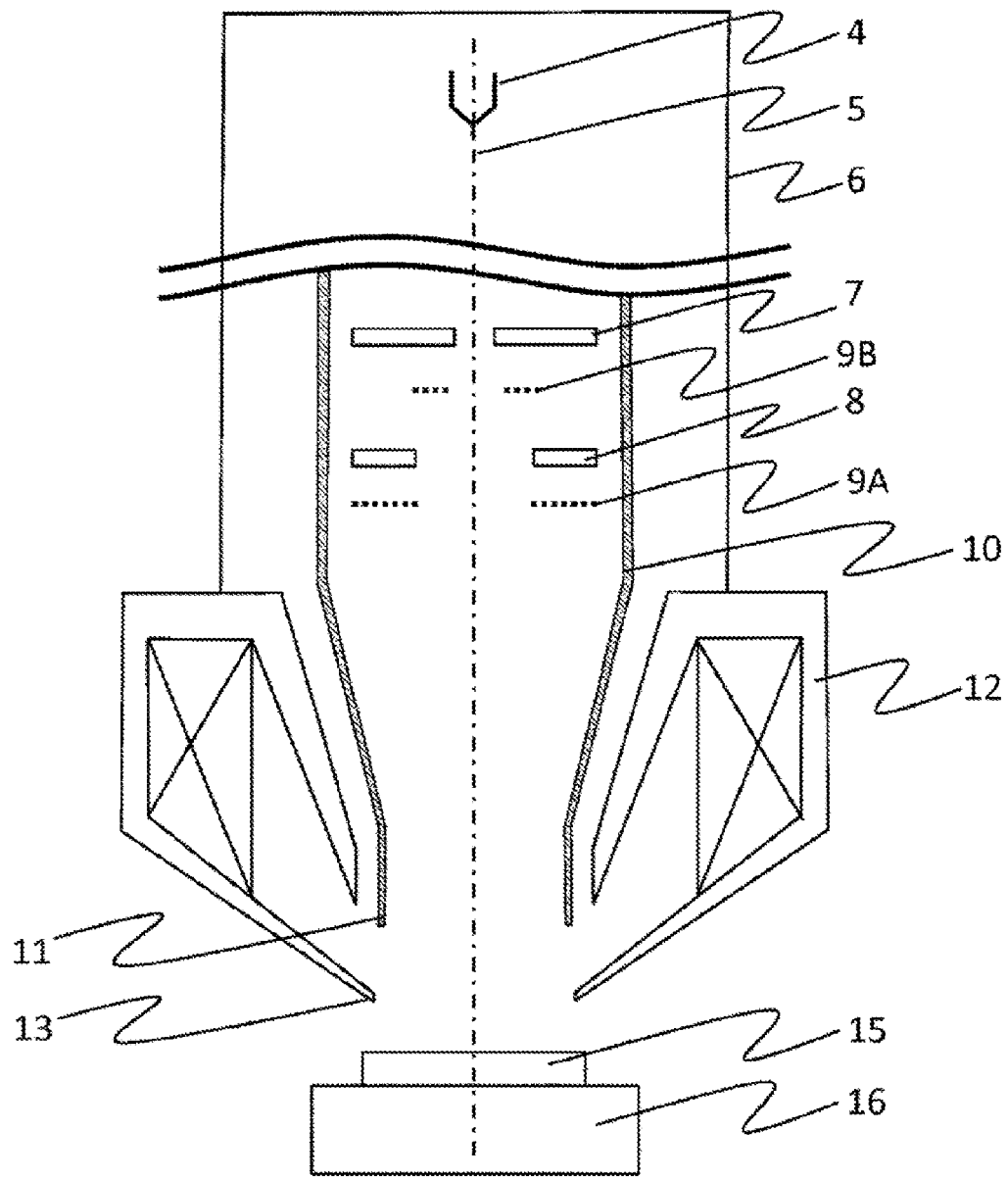
FIG. 5 is a schematic cross-sectional diagram illustrating a scanning electron microscope according to the first embodiment.

To reduce shading in an SEM image of a backscattered electron, it is possible to consider the configuration illustrated in FIG. 5 where the second detector is provided with an energy filter 9B, which is separate from the energy filter installed on the first detector. In this configuration, the energy filter 9B is disposed so that all the signal electrons 1 heading to the sensitive surface 7 of the second detector must pass through energy filter 9B prior to reaching the sensitive surface 7 of the second detector. In an SEM image displaying linear addition signals of the first detector and the second detector under the condition where both the energy filter 9A of the first detector and the energy filter 9B of the second detector are turned on, an SEM image of a backscattered electron can be acquired without shading. For the aforementioned reason, in an SEM image displaying linear addition signals of the first detector and the second detector under the condition where both the energy filter 9A of the first detector and the energy filter 9B of the second detector are turned off, an SEM image of a secondary electron can be acquired without shading. It is possible to provide an SEM that addresses a broad range of magnification factors for an energy-filtered SEM image. To obtain an SEM image of a backscattered electron under the condition where the energy filter 9A of the first detector and the energy filter 9B of the second detector are turned on, a configuration where different filter voltages can be set is desirable.

Second Embodiment

Figure 6:
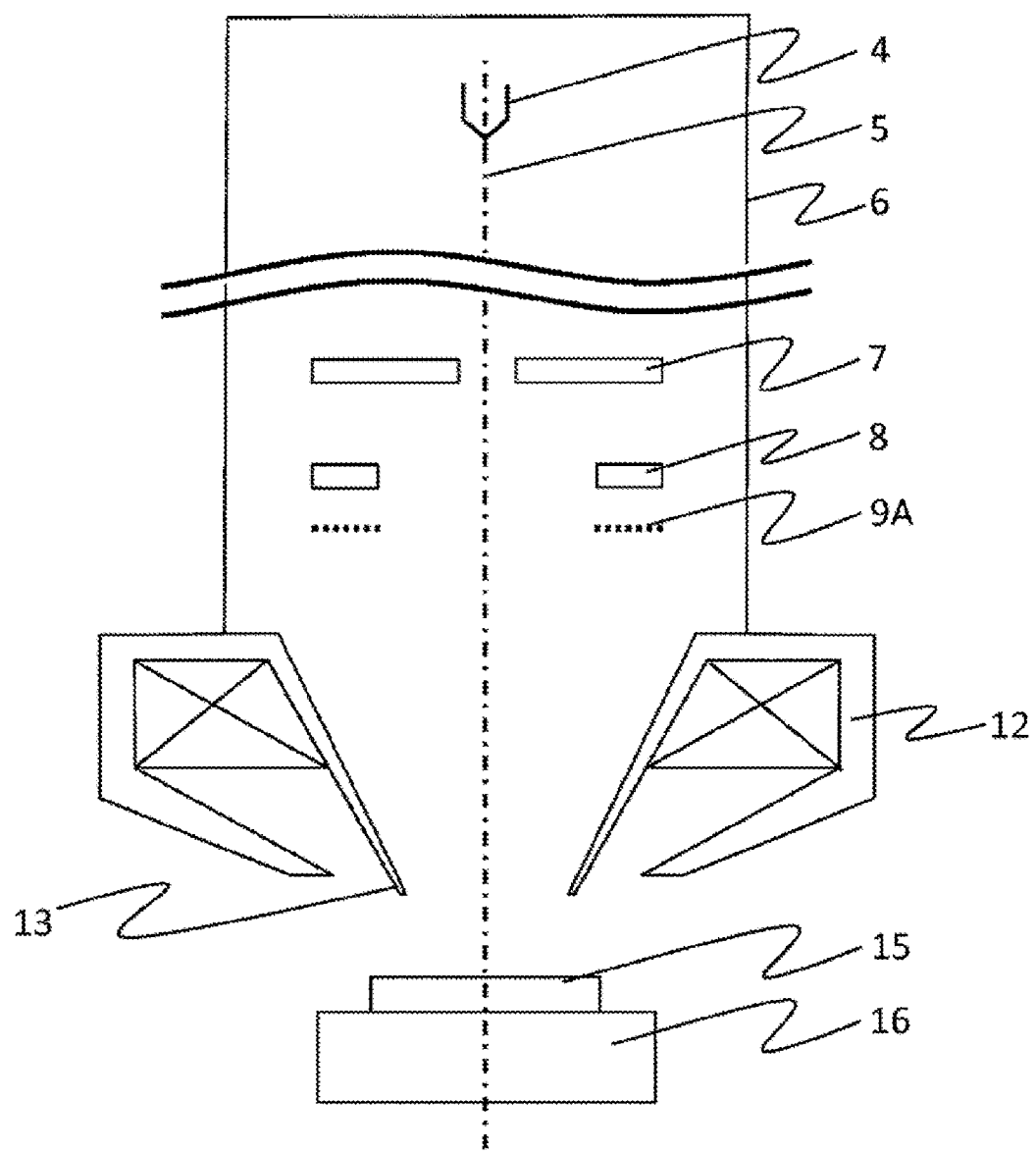
FIG. 6 is a schematic cross-sectional diagram illustrating a scanning electron microscope according to a second embodiment.

FIG. 6 illustrates a conceptual diagram of the overall configuration of the scanning electron microscope according to this embodiment. The main differences from the first embodiment are hereinafter described:

The scanning electron microscope illustrated in FIG. 6 broadly includes: the electron gun 4; an aperture; a condenser lens; an objective lens; a second detector; a first detector; the energy filter 9A; a deflector; the sample 15; a controller that controls the sample stand 16 and the mechanism of the sample stand 16, an SEM image display device, and the entire SEM; and a vacuum exhaust facility.

The type of the objective lens of the scanning electron microscope of FIG. 6 is different from the type of the objective lens according to the first embodiment. The objective lens according to this embodiment is of a semi-in-lens type intended to leak a magnetic field to the sample. The resolution thereby achieved is higher than that achieved in the configuration of the first embodiment.

The principle in which the effect of shading can be reduced in an SEM image that can be acquired by performing addition of output signals of the first detector and the second detector is the same as the principle of the first embodiment.

In FIG. 6, the electric potential of the sample side tip 13 of the objective lens magnetic path is higher than that of the sample 15. This electric potential difference is denoted by Vd, as in the case of the first embodiment. In the configuration according to this embodiment, short focus is achieved by a magnetic field lens. The electric field lens strength is weaker than that according to the first embodiment, and the value of Vd is set to range from 1 to 5 kV. At this electric potential difference, the scintillator does not emit light when the detector is of an ET type. It is desirable that the electric potentials of the sensitive surface 7 of the first detector and the sensitive surface 8 of the second detector are set to be different from the electric potential of the objective lens 12 and higher than the potential of the sample 15 by approximately 10 kV. As illustrated in the first embodiment, when detecting a conversion electron generated by collision with a conversion electrode, there is no problem even if the electric potentials of the sensitive surface 7 of the first detector and the sensitive surface 8 of the second detector are set equal to the electric potential of the objective lens magnetic path 12.

Figure 7:
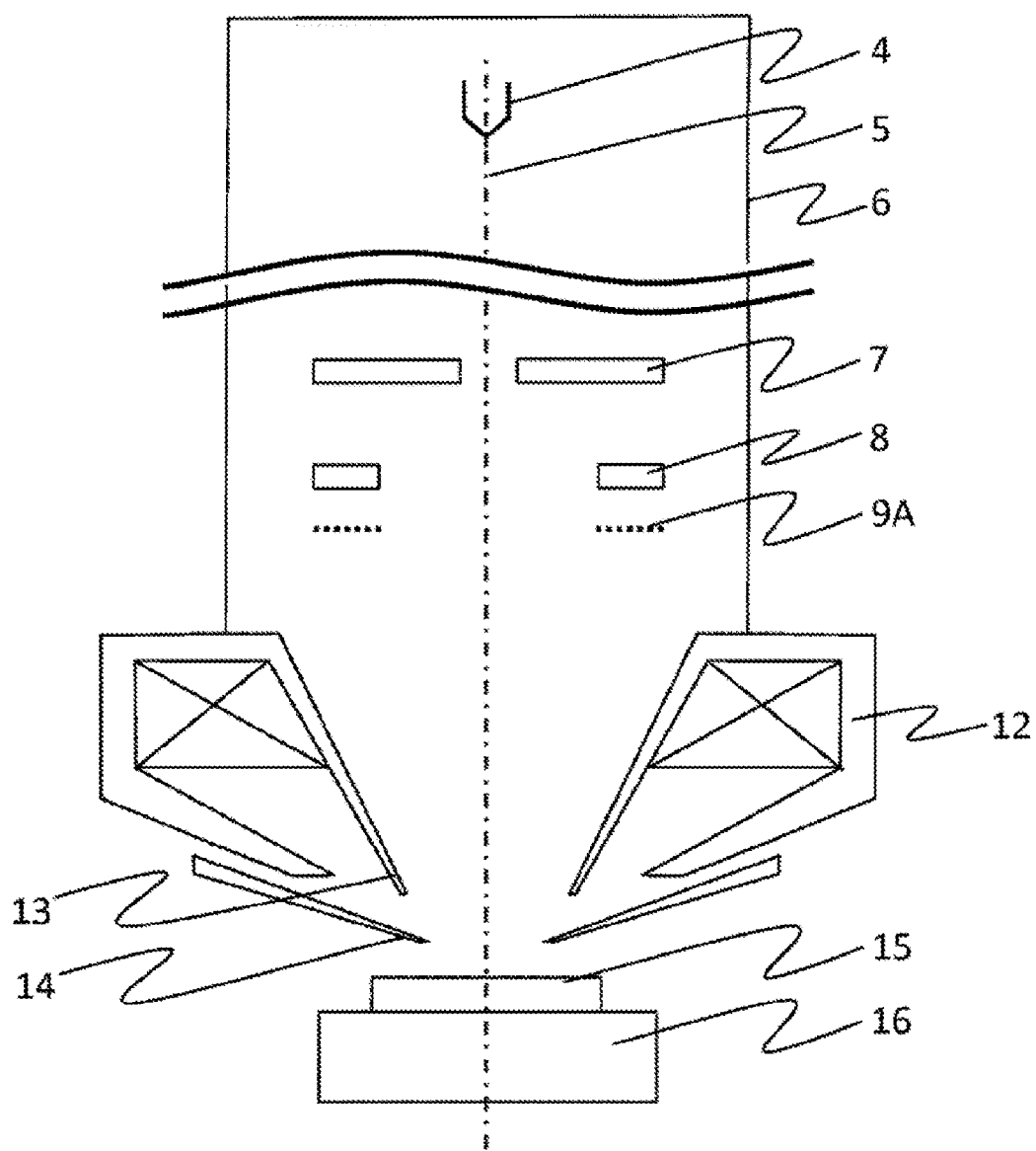
FIG. 7 is a schematic cross-sectional diagram illustrating a scanning electron microscope according to the second embodiment.

When the sample is inclined in the configuration of FIG. 5, the electric fields of the sample side tip 13 of the objective lens magnetic path and the sample 15 are no longer symmetrical, and resolution is decreases to a significant extent. To avoid this, it is possible to adopt the configuration illustrated in FIG. 7 where an electric field control electrode 14 is additionally disposed on the sample side of the lower magnetic path of the objective lens 12. In this case, the electrode 14 needs to be a non-magnetic body. As in the case of the first embodiment, it is desirable that the electric potential difference between the electrode 14 and the sample 15 is set to 1 kV or below.

Figure 8:
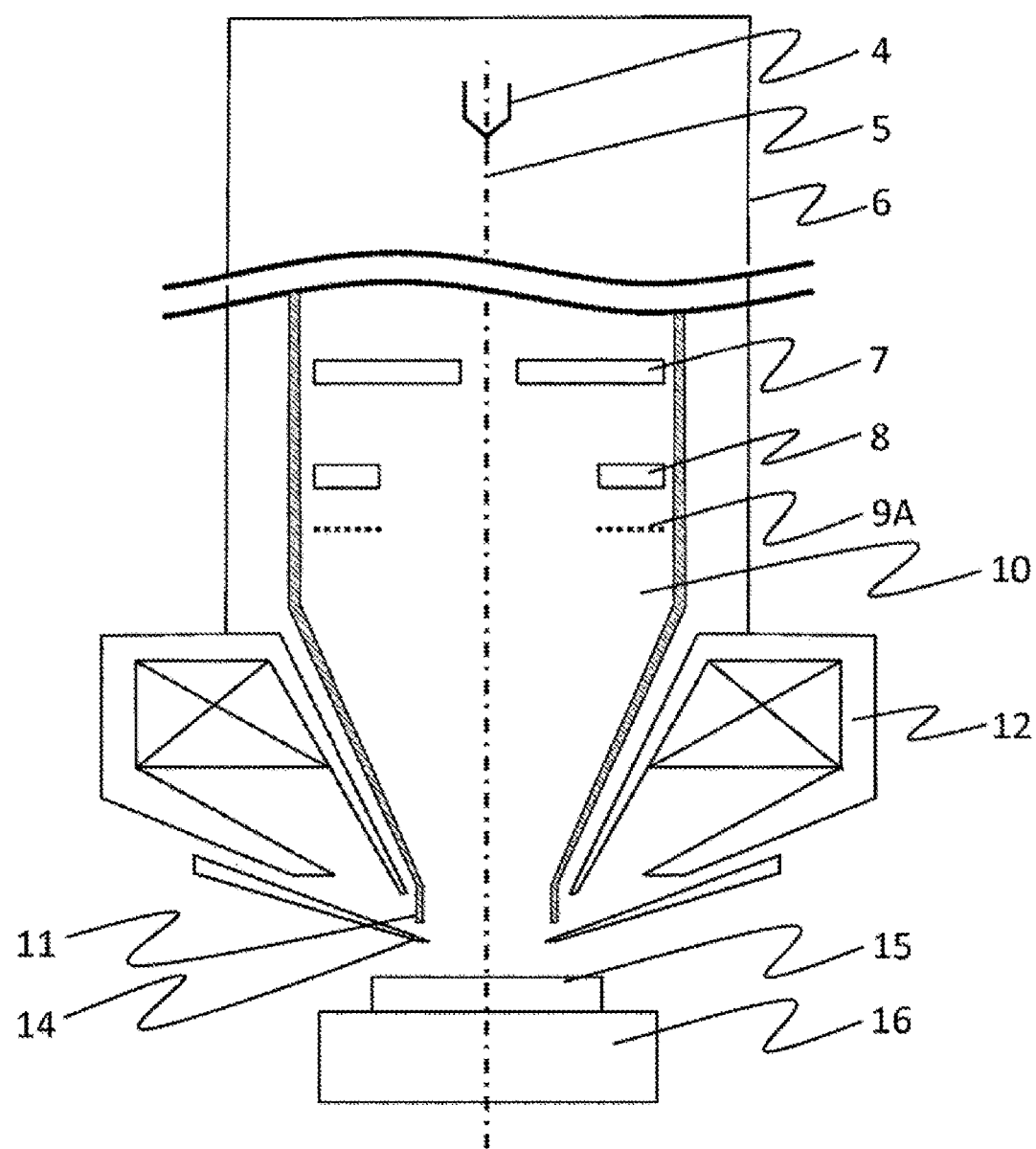
FIG. 8 is a schematic cross-sectional diagram illustrating a scanning electron microscope according to the second embodiment.

As in the case of the first embodiment, as illustrated in FIG. 8, a cylindrical electrode 10 containing the first detector and the second detector may be disposed. In this configuration, the electric potential difference between the sample side tip 11 of the cylindrical electrode and the electric field control electrode 14 is denoted by Vd.

Figure 9:
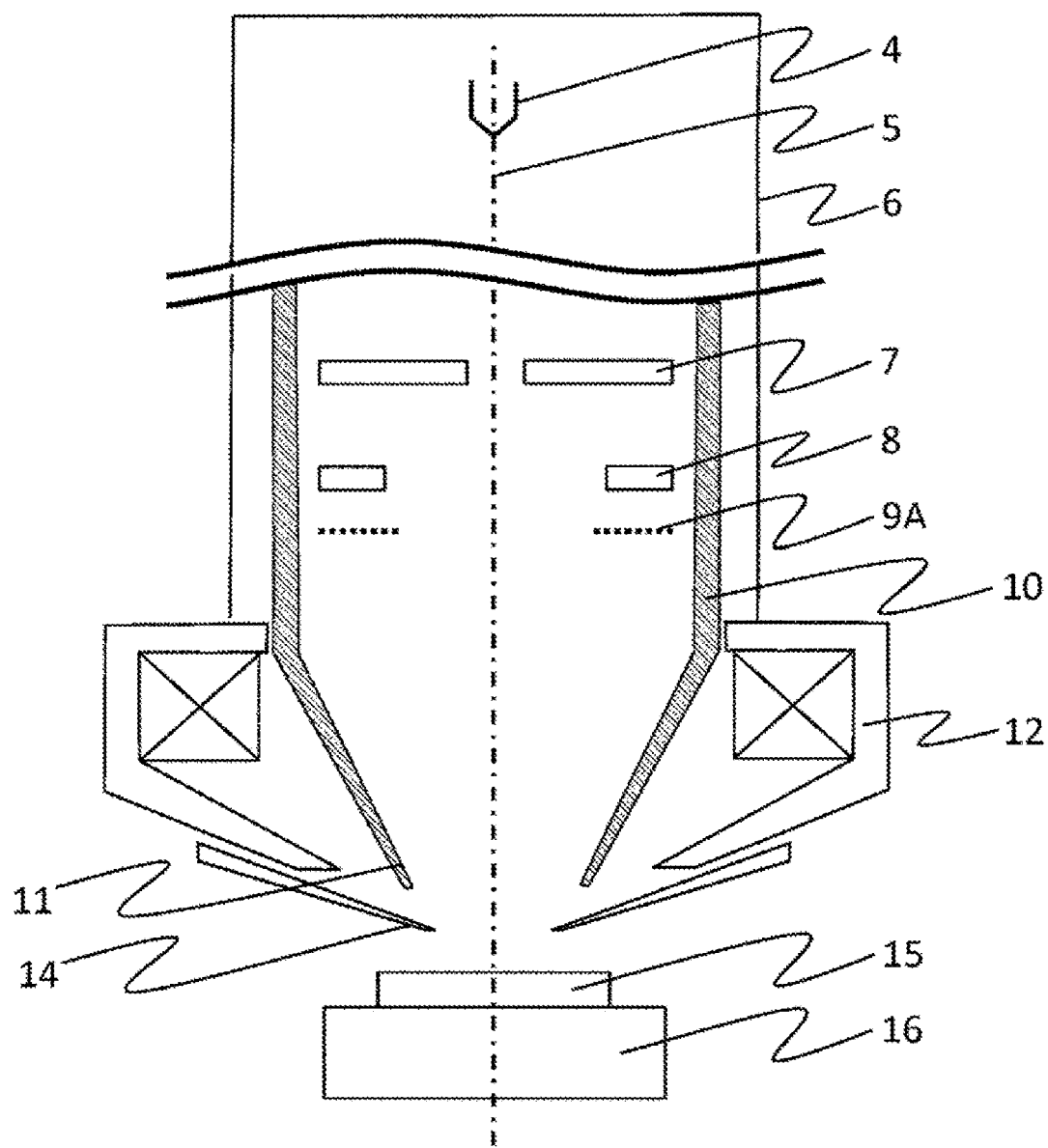
FIG. 9 is a schematic cross-sectional diagram illustrating a scanning electron microscope according to the second embodiment.

To increase the yield of the signal electron 1 detected by the first detector and the second detector, the configuration illustrated in FIG. 9 where the cylindrical electrode 10 doubles as the upper magnetic path of the objective lens may be adopted. In this case, the cylindrical electrode 10 is composed of a magnetic body.

Figure 10:
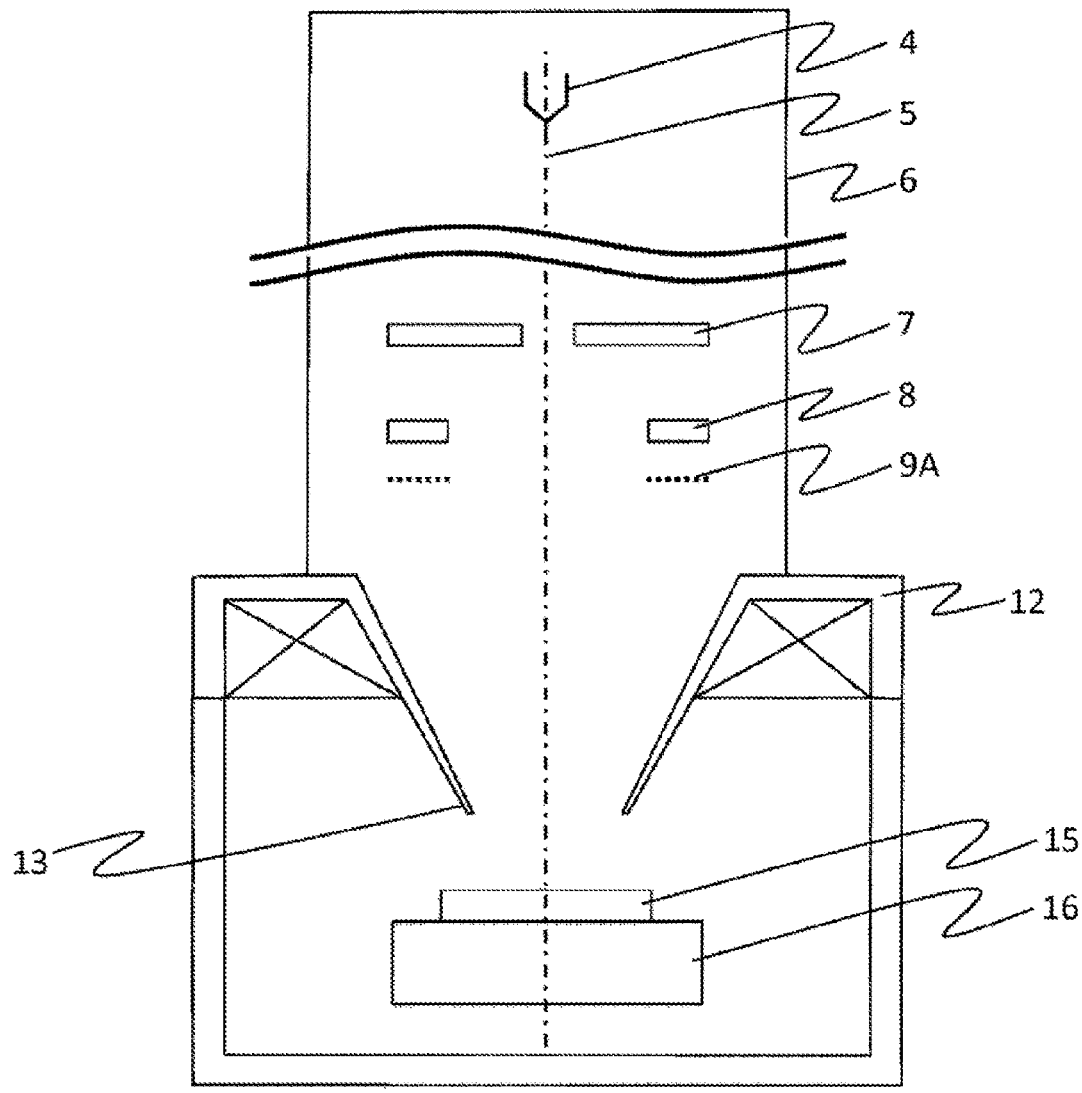
FIG. 10 is a schematic cross-sectional diagram illustrating a scanning electron microscope according to the second embodiment.
Figure 11:
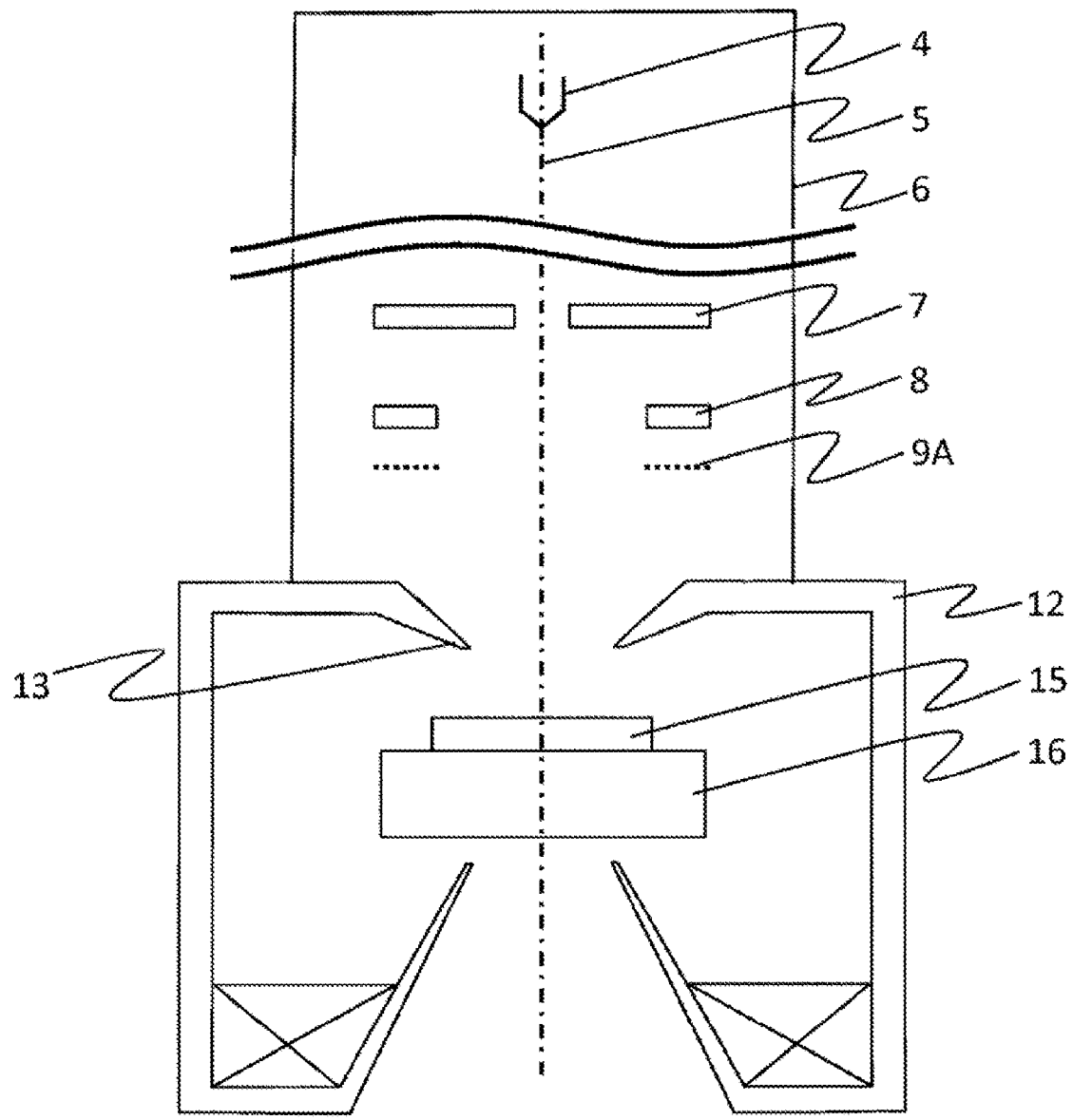
FIG. 11 is a schematic cross-sectional diagram illustrating a scanning electron microscope according to the second embodiment.

Even when the aforementioned configurations are applied to the unipotential objective lens of FIG. 10 and the in-lens type objective lens of FIG. 11, production of the same effect can be expected.

REFERENCE SIGNS LIST 1 signal electron
2 secondary electron
3 backscattered electron
4 electron gun
5 optical axis
6 SEM barrel
7 sensitive surface of second detector
8 sensitive surface of first detector
9A retarding field energy filter applied to signal electron 1 detected by first detector
9B retarding field energy filter applied to signal electron 1 detected by second detector
10 cylindrical electrode
11 sample side tip of cylindrical electrode
12 objective lens magnetic path
13 sample side tip of objective lens magnetic path
14 electrical field control electrode
15 sample
16 sample stand
17A second detector A for detecting conversion electron
17B second detector B for detecting conversion electron
18A first detector A for detecting conversion electron
18B first detector B for detecting conversion electron

The invention claimed is:

1. A scanning electron microscope comprising:
an electron source configured to generate an electronic beam acting as a probe;
an aperture configured to limit a diameter of the electronic beam;
a sample stand mounted with a sample to which the electronic beam is irradiated;
an electron lens including an objective lens configured to converge the electronic beam to a surface of the sample;
a deceleration means configured to decelerate the electronic beam having passed the objective lens as the electronic beam nears the sample;
a deflector configured to scan the electronic beam on a sample; and
at least two detectors configured to detect only a signal electron, the signal electron having passed through an objective lens, of all signal electrons released from the sample, wherein
the two detectors are arranged between the electron source and the objective lens,
two sensitive surfaces are shaped to be axisymmetrical with reference to an optical axis,
when one of the detectors is a first detector disposed to constantly detect a high-energy signal electron having passed through a retarding field energy filter and another of the detectors, which is different from the first detector, is a second detector, the first detector is installed closer to a sample side than the second detector is, and
$L1/L2 \leq 5/9$ holds true where L1 denotes a distance between a top end portion on the sample side of the objective lens and a sensitive surface of the first detector and L2 denotes a distance between the top end portion on the sample side of the objective lens and a sensitive surface of the second detector.

2. The scanning electron microscope according to claim 1 further comprising:
a signal processing circuit configured to perform linear addition of output signals from the first detector and the second detector.

3. The scanning electron microscope according to claim 1, wherein
the first detector detects a backscattered electron, and the second detector detects a secondary electron.

4. The scanning electron microscope according to claim 1, wherein
the retarding field energy filter is provided as a unit separate from the first detector.

5. The scanning electron microscope according to claim 1, wherein
the retarding field energy filter is provided as a unit integrated with the first detector.

6. The scanning electron microscope according to claim 1, wherein
the retarding field energy filter is installed on the sample side with respect to the sensitive surface of the second detector, and
a high-energy electron having passed through the deceleration means is detected by each of the first detector and the second detector.

7. The scanning electron microscope according to claim 1, wherein
a detection solid angle of a first detector facing a top end portion of an objective lens is greater than a detection solid angle of a second detector.

8. The scanning electron microscope according to claim 1, wherein
a detector used as a first detector or a second detector is: a semiconductor detector; a detector employing an avalanche diode, a micro channel plate, or a scintillator material as a constituent element; or a combination of the aforementioned detectors.

9. A scanning electron microscope comprising:
an electron source configured to generate an electronic beam acting as a probe;
an aperture configured to limit a diameter of the electronic beam;
a sample stand mounted with a sample to which the electronic beam is irradiated;
an electron lens including an objective lens configured to converge the electronic beam to a surface of the sample;
a deceleration means configured to decelerate the electronic beam having passed the objective lens as the electronic beam nears the sample;
a deflector configured to scan the electronic beam on a sample; and
at least two conversion plates configured to be collided with only a signal electron, the signal electron having passed through an objective lens, of all signal electrons released from the sample, wherein
the two conversion plates are arranged between the electron source and the objective lens,
collision surfaces of the two conversion plates are shaped to be axisymmetrical with reference to an optical axis,
when one of the conversion plates is a first conversion plate disposed to be constantly collided with a high-energy signal electron having passed through a retarding field energy filter and another of the conversion plates, which is different from the first conversion plate, is a second conversion plate, the first conversion plate is disposed closer to a sample side than the second conversion plate is, and
L1/L2≤5/9 holds true where L1 denotes a distance between a top end portion on the sample side of the objective lens and a collision surface of the first conversion plate and L2 denotes a distance between the top end portion on the sample side of the objective lens and a collision surface of the second conversion plate.

10. The scanning electron microscope according to claim 9 further comprising:
first and second detectors including sensitive surfaces configured to detect a conversion electron released from the collision surface to the sample side by a signal electron having collided with the first conversion plate, wherein the first and second detectors are arranged outside of the optical axis and axisymmetrical with reference to the optical axis; and
third and fourth detectors including sensitive surfaces configured to detect a conversion electron released from the collision surface to the sample side by a signal electron having collided with the second conversion plate, wherein the third and fourth detectors are arranged outside of the optical axis and axisymmetrical with reference to the optical axis.

11. The scanning electron microscope according to claim 10 further comprising:
a signal processing circuit configured to perform linear addition of output signals from the first, second, third, and fourth detectors.

12. The scanning electron microscope according to claim 10, wherein
a detector used in first, second, third, or fourth detector is a detector employing a scintillator material as a constituent element or a combination of the aforementioned detectors.

13. The scanning electron microscope according to claim 9, wherein
a conversion electron generated by collision of a back-scattered electron with the first conversion plate is detected, and a conversion electron generated by collision of a secondary electron with the second conversion plate is detected.

14. The scanning electron microscope according to claim 9, wherein
the retarding field energy filter is provided as a unit separate from the first conversion plate.

15. The scanning electron microscope according to claim 9, wherein
the retarding field energy filter is provided as a unit integrated with the first conversion plate.

16. The scanning electron microscope according to claim 9, wherein
the retarding field energy filter is installed on the sample side with respect to the collision surface of the second conversion plate, and
a high-energy electron having passed through the deceleration means collides with each of the first conversion plate and the second conversion plate.

17. The scanning electron microscope according to claim 9, wherein
a collision solid angle of a first conversion plate facing a top end portion of an objective lens is greater than a collision solid angle of a second conversion plate.

18. The scanning electron microscope according to claim 9, wherein
the collision surfaces of the first and second conversion plates contain a material whose atomic number is 50 or higher.

19. The scanning electron microscope according to claim 9, wherein
the collision surfaces of the first and second conversion plates contain a material having a negative electron affinity.

* * * * *